(12) United States Patent
Sasaki et al.

(10) Patent No.: US 7,983,048 B2
(45) Date of Patent: Jul. 19, 2011

(54) STRUCTURE FOR MOUNTING SEMICONDUCTOR PACKAGE

(75) Inventors: Junichi Sasaki, Tokyo (JP); Tomoyuki Hino, Tokyo (JP)

(73) Assignee: NEC Corporation, Tokyo (JP)

( * ) Notice: Subject to any disclaimer, the term of this patent is extended or adjusted under 35 U.S.C. 154(b) by 60 days.

(21) Appl. No.: 12/525,957

(22) PCT Filed: Nov. 30, 2007

(86) PCT No.: PCT/JP2007/073200
§ 371 (c)(1),
(2), (4) Date: Aug. 5, 2009

(87) PCT Pub. No.: WO2008/099554
PCT Pub. Date: Aug. 21, 2008

(65) Prior Publication Data
US 2010/0309635 A1    Dec. 9, 2010

(30) Foreign Application Priority Data

Feb. 15, 2007    (JP) .................................. 2007-035101

(51) Int. Cl.
*H05K 7/20* (2006.01)
(52) U.S. Cl. .................. 361/719; 361/679.54; 361/704; 361/709; 361/710; 165/80.3; 165/104.33; 165/185; 257/712; 257/718; 257/719; 174/16.3; 174/252
(58) Field of Classification Search ............. 361/679.46, 361/679.54, 704–712, 717–723, 734, 786; 165/80.2, 80.3, 80.4, 104.33, 104.34, 185; 257/706–727; 174/16.3, 252
See application file for complete search history.

(56) References Cited

U.S. PATENT DOCUMENTS

| 4,563,725 | A | * | 1/1986 | Kirby ............................. 361/708 |
| 5,099,550 | A | * | 3/1992 | Beane et al. .................... 24/555 |
| 5,856,911 | A | * | 1/1999 | Riley ............................ 361/704 |
| 5,883,782 | A | * | 3/1999 | Thurston et al. .............. 361/704 |
| 5,920,120 | A | * | 7/1999 | Webb et al. .................... 257/719 |
| 6,219,243 | B1 | * | 4/2001 | Ma et al. ........................ 361/704 |
| 6,268,239 | B1 | * | 7/2001 | Ikeda ............................ 438/122 |
| 6,297,959 | B1 | * | 10/2001 | Ueno et al. ..................... 361/704 |
| 6,431,259 | B2 | * | 8/2002 | Hellbruck et al. ........... 165/80.3 |
| 6,490,161 | B1 | * | 12/2002 | Johnson ........................ 361/704 |
| 6,580,611 | B1 | * | 6/2003 | Vandentop et al. ........... 361/704 |
| 6,657,866 | B2 | * | 12/2003 | Morelock ..................... 361/719 |

(Continued)

FOREIGN PATENT DOCUMENTS

JP    63-090159 A    4/1988

(Continued)

OTHER PUBLICATIONS

International Search Report for PCT/JP2007/073200 mailed Feb. 12, 2008.

(Continued)

*Primary Examiner* — Michael V Datskovskiy

(57) ABSTRACT

A mounting structure, in which semiconductor package 1 and heat sink 8 for dissipating heat generated from semiconductor package 1 are mounted on mounting board 3. The rear surface of semiconductor package 1 is bonded to the front surface of mounting board 3 facing the rear surface. Heat sink 8 is brought into contact with the rear surface of semiconductor package 1 via through-ole 5 formed on mounting board 3. Semiconductor package 1 and heat sink 8 are pressed to each other by the elastic force of clip 6.

2 Claims, 5 Drawing Sheets

U.S. PATENT DOCUMENTS

| | | | |
|---|---|---|---|
| 6,816,375 B2 * | 11/2004 | Kalyandurg | 361/704 |
| 6,867,492 B2 * | 3/2005 | Auburger et al. | 257/706 |
| 6,933,604 B2 * | 8/2005 | Sakamoto et al. | 257/720 |
| 6,939,742 B2 * | 9/2005 | Bhatia et al. | 438/117 |
| 7,072,184 B2 * | 7/2006 | Kalyandurg | 361/704 |
| 7,257,004 B2 * | 8/2007 | Costello | 361/719 |
| 7,268,425 B2 * | 9/2007 | Mallik et al. | 257/706 |
| 7,428,154 B2 * | 9/2008 | Ishimine et al. | 361/704 |
| 7,456,047 B2 * | 11/2008 | Mallik et al. | 438/108 |
| 7,518,235 B2 * | 4/2009 | Coico et al. | 257/719 |
| 7,558,066 B2 * | 7/2009 | Eckberg et al. | 361/704 |
| 7,706,144 B2 * | 4/2010 | Lynch | 361/704 |
| 7,782,621 B2 * | 8/2010 | Matsushiba et al. | 361/714 |
| 2004/0084764 A1 * | 5/2004 | Ishimine et al. | 257/706 |
| 2004/0174679 A1 * | 9/2004 | Hung et al. | 361/704 |

FOREIGN PATENT DOCUMENTS

| | | |
|---|---|---|
| JP | 3-268348 A | 11/1991 |
| JP | 5-004577 A | 1/1993 |
| JP | 05-259670 A | 10/1993 |
| JP | 5-259670 A | 10/1993 |
| JP | 6-037216 A | 2/1994 |
| JP | 6-196598 A | 7/1994 |
| JP | 7-030011 A | 1/1995 |
| JP | 7-283349 A | 10/1995 |
| JP | 8-335656 A | 12/1996 |
| JP | 9-321188 A | 12/1997 |
| JP | 2000323869 A | 11/2000 |
| JP | 2005142292 A | 6/2005 |

OTHER PUBLICATIONS

I. Hatakeyama et al., OPTRONICS, 2005, p. 180-189.

* cited by examiner

STRUCTURE FOR MOUNTING SEMICONDUCTOR PACKAGE

The present application is the National Phase of PCT/JP2007/073200, filed Nov. 30, 2007, which is based upon and claims priority from Japanese Patent Application Number 2007-35101, filed Feb. 15, 2007, the disclosure of which is hereby incorporated by reference herein in its entirety.

TECHNICAL FIELD

The present invention relates to a structure for mounting a semiconductor package. In the application, the term "semiconductor package" shall be construed to include an electric module including a semiconductor device such as an Large Scale Integration (LSI) device, an optical module including an optical semiconductor device such as a semiconductor laser, an optoelectronic module incorporating an LSI and an optical semiconductor.

BACKGROUND ART

In the case where a semiconductor package consuming a large amount of is electricity such as a Central Processing Unit (CPU) and an optoelectronic module is mounted on a board and the like to be used in a computer, means for dissipating heat from the semiconductor package is generally required.

Japanese laid-open publication No. H09-321188 discloses a structure for mounting a semiconductor package as shown in FIG. 1. The semiconductor package shown in FIG. 1 is mounted on board 51. And heat sink 54 is placed on top of semiconductor package 52 mounted on board 51. Heat sink 54 is in tight contact with the top surface of semiconductor package 52 due to the elastic force of leaf spring 55. The heat sink used in that mounting structure is made of excellent heat conductivity material, and is shaped to efficiently dissipate absorbed heat into the air.

In some cases, however, it is impossible or difficult to mount a heat sink on top of a semiconductor package depending to the shape of the semiconductor package. For example, semiconductor package 60 shown in FIG. 2 is an optoelectronic module, with light input/output part 61 provided on the top portion thereof. This structure makes it impossible to mount the heat sink on top of this semiconductor package. Accordingly, in the example shown in FIG. 2, a structure for dissipating heat from the underside of semiconductor package 60 through solder balls 63 to mounting board 62 is employed. The mounting structure shown in FIG. 2 is disclosed in OPTRONICS (2005), No. 1, page 184.

However, most mounting boards are made of resin and have great thermal resistance. Accordingly, this structure cannot sufficiently dissipate heat from the optoelectronic module that generates a large amount of heat. As a mounting structure for overcoming that problem, the specification of Japanese laid-open publication No. H07-283349 discloses a mounting structure shown in FIG. 3. Specifically, semiconductor package 72 is mounted on the front surface of mounting board 71 in which through-holes 70 are formed, and heat sink 73 is mounted on the rear surface of mounting board 71. In the mounting structure shown in FIG. 3, heat generated from semiconductor package 72 is transferred through through-holes 70 and the like to heat sink 73, which in turn dissipates the heat from the surface into the air. In the mounting structure shown in FIG. 3, since Charge-Coupled Device (CCD) image sensor is mounted on the top surface of the semiconductor package 72, the heat from semiconductor package 72 is dissipated through the opposite surface.

DISCLOSURE

Technical Problem

According to the specification of Japanese laid-open publication No. H07-283349 disclosing the mounting structure shown in FIG. 3, screwing, fitting based on a protrusion and a mating recess, and bonding are disclosed as means for fixing the heat sink 73 to the mounting structure 71. However, if the mounting board and the heat sink are rigidly fixed to each other, an external force applied to the heat sink may be directly transferred to coupling parts between the semiconductor package and the mounting board, thereby damaging the coupling parts. External force is applied to the heat sink for example when a human hand or a tool touches the heat sink.

In order to reduce such a danger, a mounting structure as shown in FIG. 4 can be introduced by combining the mounting structure shown in FIG. 1 and the mounting structure shown in FIG. 3. Specifically, semiconductor package 82 is mounted on the front surface of mounting board 81 having through-hole 80 formed therein, heat sink 83 is disposed on the rear surface of mounting board 81, and semiconductor package 82 and heat sink 83 are brought into close contact with each other via through-hole 80. In addition, heat sink 83 is pressed against the rear surface of the semiconductor package 82 via leaf springs 84 fixed to the rear surface of mounting board 81.

However, as shown in FIG. 4, semiconductor package 82 is bonded to mounting board 81 via solder balls 85. The elastic force of leaf springs 84 (i.e., a force pressing heat sink 83 against semiconductor package 82) acts from downside to upside of the paper plane. As a result, tensile stress f1 is constantly applied to solder balls 85. This causes a new problem in which damage is caused to the connection reliability between semiconductor package 82 and mounting board 81.

Technical Solution

The present invention provides a structure for mounting a semiconductor package, in which the semiconductor package and a heat-dissipating member dissipating heat generated from the semiconductor package are mounted on a mounting board. The rear surface of the semiconductor is bonded to a surface of the mounting board facing the rear surface of the semiconductor. The heat-dissipating member is brought into contact with the rear surface of the semiconductor package through an opening formed in the mounting board. In addition, the semiconductor package and the heat-dissipating member are pressed to each other by an elastic force of an elastic member.

One object of the invention is to provide a structure for mounting a semiconductor package, which has excellent heat-dissipating property without damaging the reliability of coupling parts.

The above and other objects, features and advantages of the present invention will be more apparent from the following description taken in conjunction with the accompanying drawings, which illustrate certain exemplary embodiments of the invention.

BEST MODE

Embodiment 1

Figure 1:
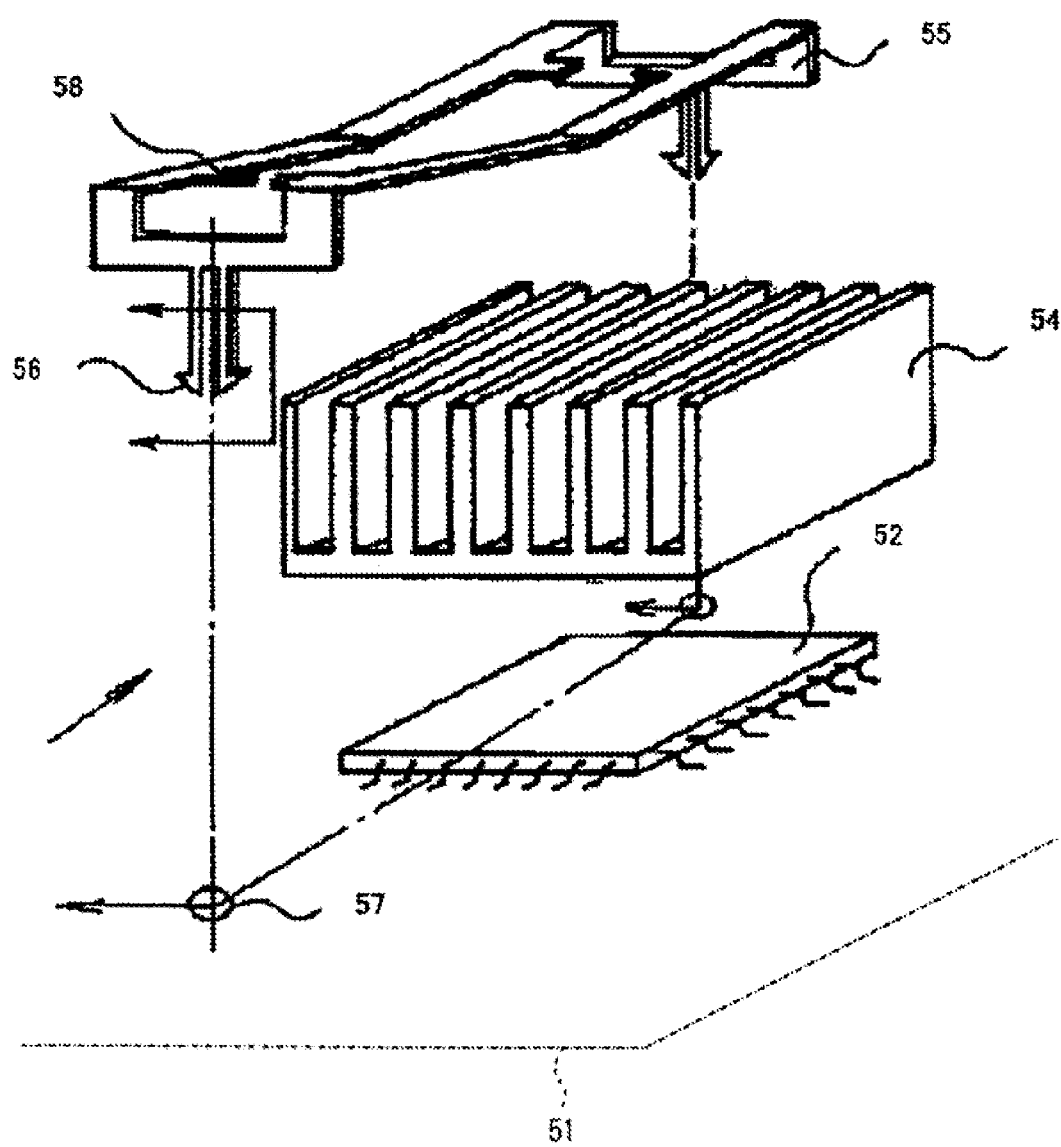
FIG. 1 is a view illustrating a mounting structure disclosed in Japanese laid-open publication No. H09-321188.
Figure 2:
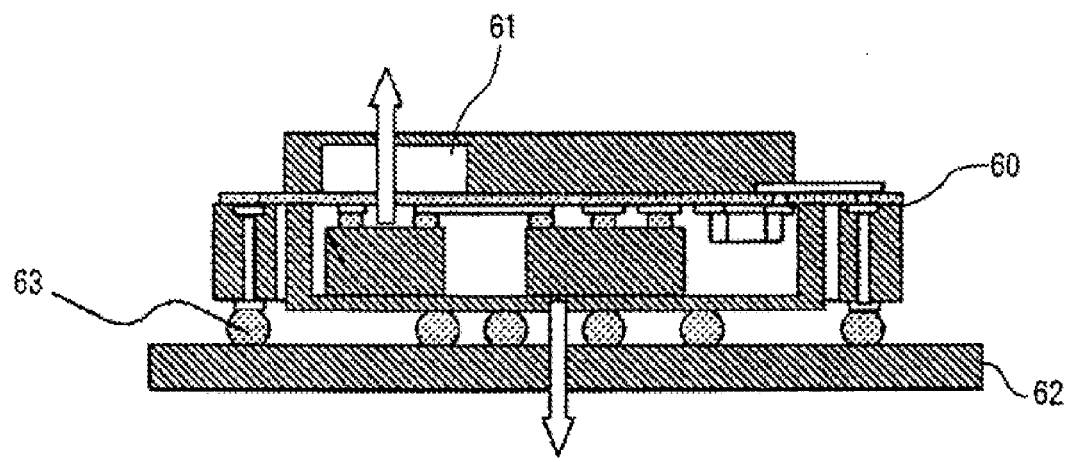
FIG. 2 is a schematic cross-sectional view illustrating an example of an optoelectronic module mounting structure.
Figure 3:
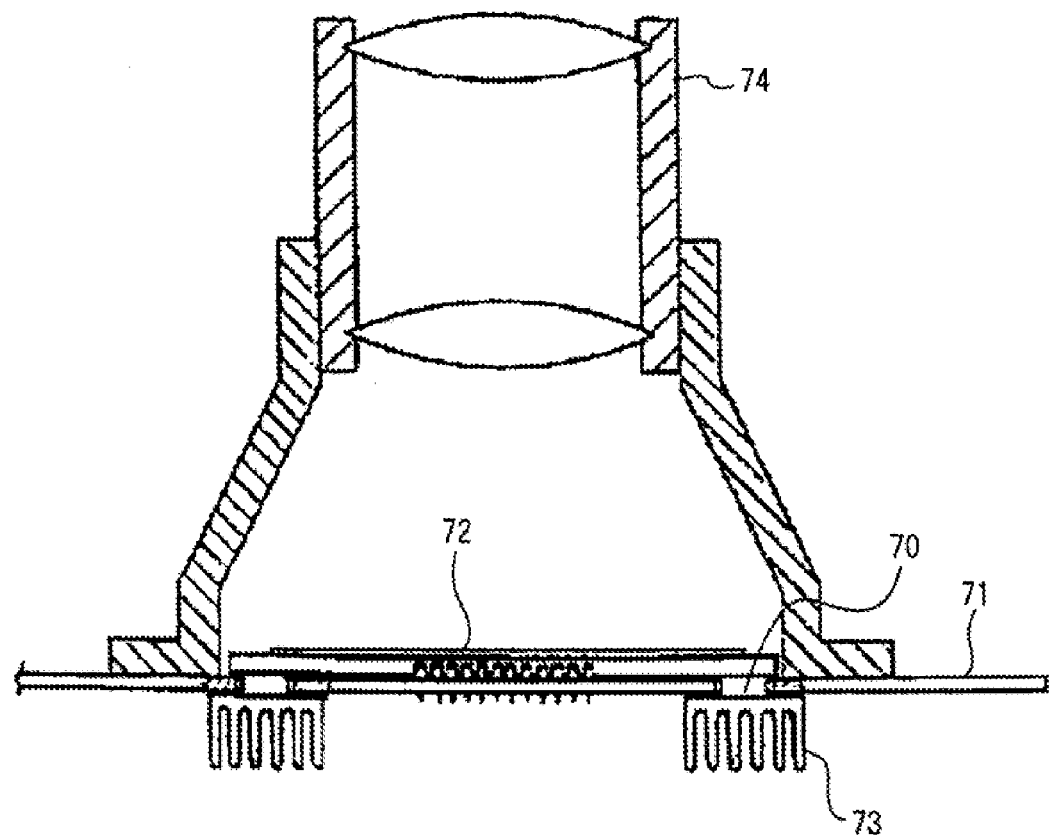
FIG. 3 is a cross-sectional view illustrating a mounting structure disclosed in Japanese laid-open publication No. H07-283349.
Figure 4:
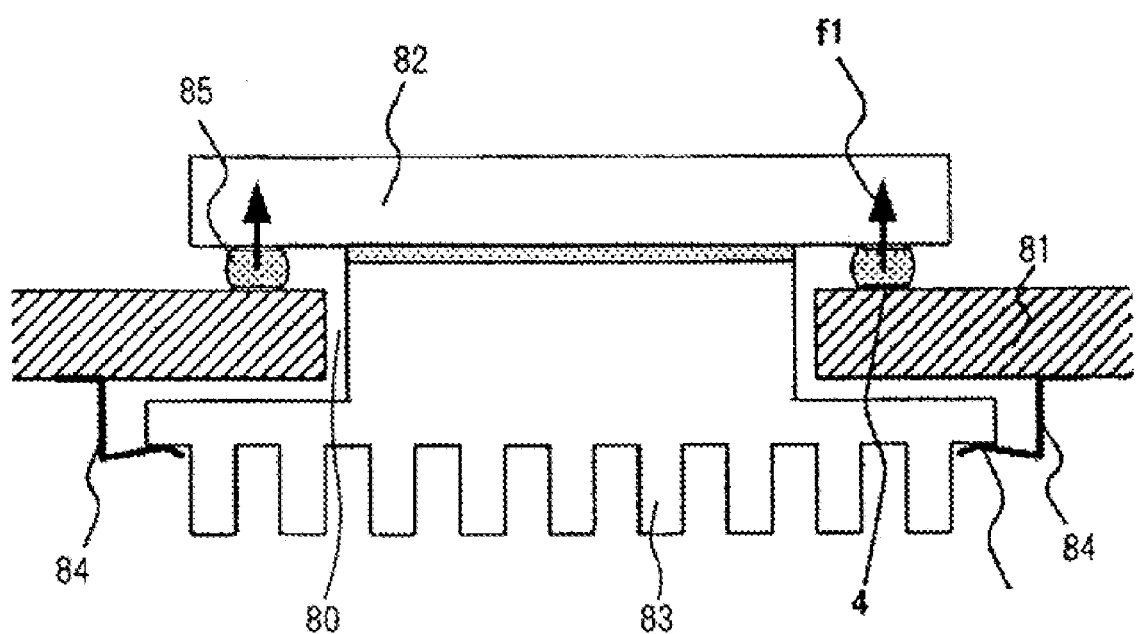
FIG. 4 is a cross-sectional view illustrating an example of a mounting structure derived by combining some examples of the related art.
Figure 5:
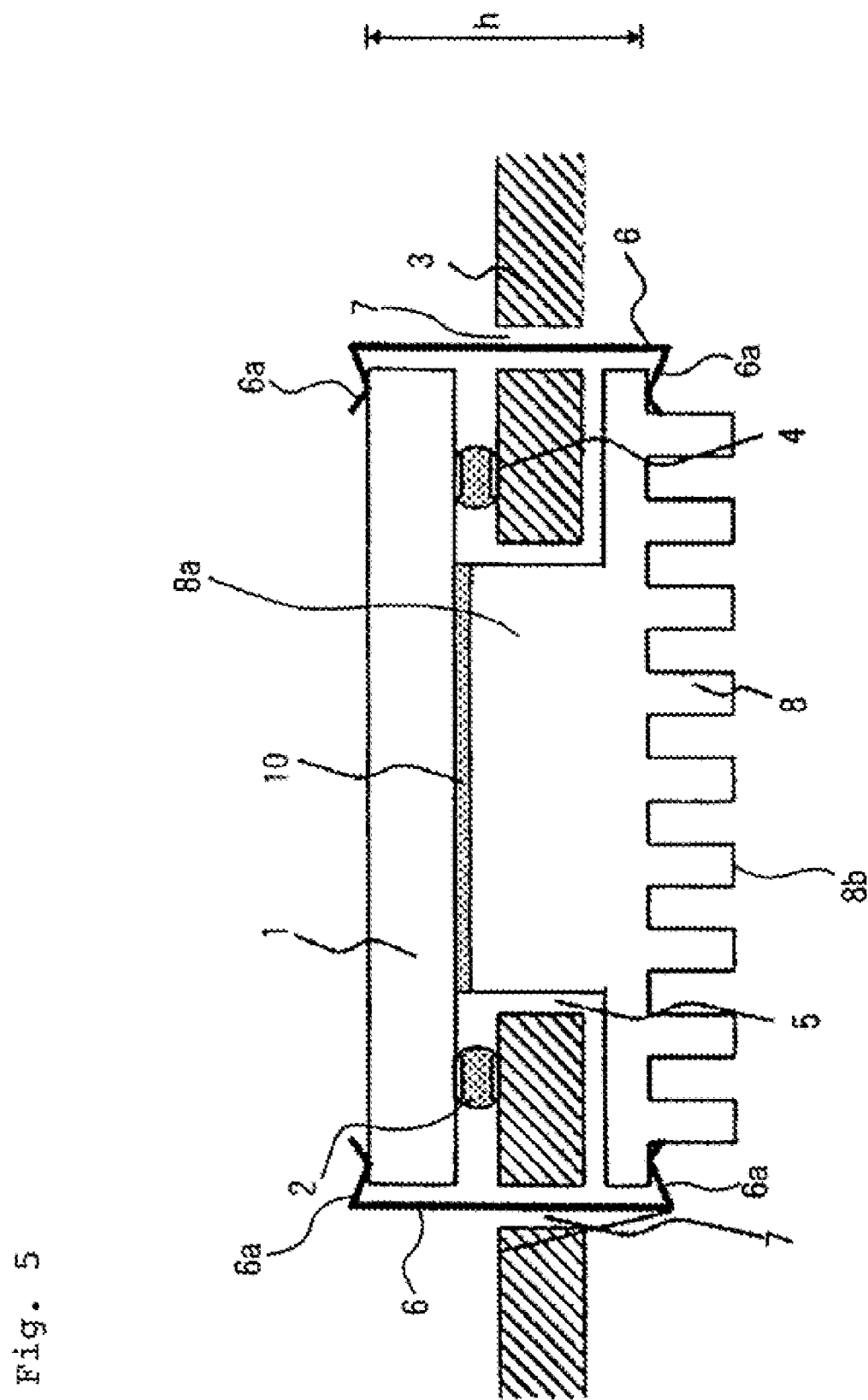
FIG. 5 is a cross-sectional view illustrating a structure for mounting a semiconductor package in accordance with an exemplary embodiment of the invention.

One exemplary embodiment of the present invention will now be described more fully hereinafter with reference to the accompanying drawing. FIG. 5 is a schematic cross-sectional view illustrating a structure for mounting a semiconductor package in accordance with this embodiment. As shown in this figure, the rear surface of semiconductor 1 is bonded to the surface of mounting board 3 via solder balls 2. This bonding structure can be realized for example as follows: Firstly, a plurality of solder balls 2 are formed on the rear surface of semiconductor package 1. Then, pads 4 are formed on the surface of mounting board 3, particularly, specific places of mounting board 3 that correspond to the positions of the solder balls. Afterwards, semiconductor package 1 and mounting board 3 are aligned with each other using, for example, a chip mount so that solder balls 2 and the pads are aligned with each other. Next, semiconductor package 1 and mounting board 3 are placed into, for example, a reflow furnace and are then heated, thereby melding solder balls 2.

Through-hole 5 is formed in a package mounting area (i.e., an area overlapping semiconductor package 1) of mounting board 3. In addition, slits 7 are formed around the package mounting area, allowing elastic members (described later) to pass through.

Heat sink 8 as dissipating member is disposed on the rear surface of mounting board 3. Heat sink 8 has convex swelling part 8a, which is inserted into through-hole 5. The top surface of swelling part 8a is in contact with the rear surface of semiconductor package 1. In addition, heat dissipating material 10 for enhancing heat transfer efficiency is sandwiched between the top surface of swelling part 8a and the rear surface of semiconductor package 1. Heat dissipating material 10 is provided in the form of gel, paste or a sheet by mixing metal powder or metal oxide powder into a base material such as silicone resin. It should be understood, however, that semiconductor package 1 and heat sink 8 are not rigidly fixed to each other. In other words, they are not fixed by fixing means such as adhesive, solder and screws. Accordingly, any external force applied to heat sink 8 is not directly transferred to solder balls 2.

Heat generated from semiconductor package 1 is transferred through heat dissipating material 10 to heat sink 8, and is then dissipated from the surface of heat sink 8 into the air. In addition, a plurality of heat dissipating fins 8b are formed on the opposite side of swelling part 8a of heat sink 8.

Heat sink 8 and semiconductor package 1 are held by at least two elastic members (e.g., metal clips 6) extending through slits 7 of mounting board 3. Specifically, locking parts 6a are formed on both longitudinal ends of each clip 6.

Locking part 6a on one end of clip 6 is locked to the surface of semiconductor package 1, and locking part 6a on the other end of clip 6a is locked to the rear surface of heat sink 8. In addition, two locking parts 6a are formed by bending the two longitudinal ends of clip 6.

The interval between opposite locking parts 6a of clip 6 is the same as or slightly smaller than height (h) from the rear surface of heat sink 8 to the front surface of the semiconductor package 1. Thus, heat sink 8 and semiconductor package 1 are held by clip 6 by elastically deforming at least one of locking parts 6a. Accordingly, heat sink 8 and semiconductor package 1 inserted between opposite locking parts 6a are pressed to each other by the elastic force of clips 6 (particularly, locking parts 6a). Since the force pressing heat sink 8 to semiconductor package 1 is balanced by the force pressing semiconductor package 1 to heat skink 8, there is no danger of applying tensile stress to solder balls 2. As a result, solder balls 2 do not damage connection reliability. In contrast, the connection reliability can be improved due to compressive stress acting on solder balls 2.

Embodiment 2

Figure 6:
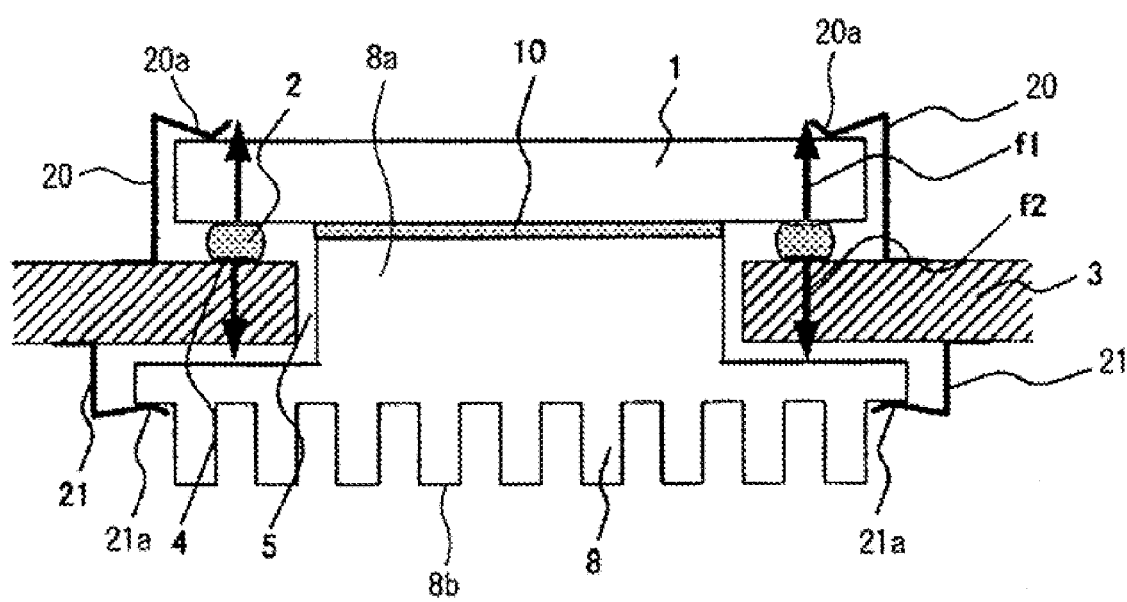
FIG. 6 is a cross-sectional view illustrating a structure for mounting a semiconductor package in accordance with another exemplary embodiment of the invention.

FIG. 6 illustrates a structure for mounting a semiconductor package in accordance with another exemplary embodiment of the invention. Also in this embodiment, the rear surface of semiconductor package 1 is bonded to the surface of mounting surface 3 via solder balls 2. In addition, the top surface of swelling part 8a of heat sink 8a is in contact with the rear surface of semiconductor package 1 via is heat dissipating material 10.

Semiconductor package 1 is pressed to heat sink 8 by at least two elastic members (e.g., leaf springs 20) fixed to surfaces of mounting board 3. More specifically, one end of each leaf spring 20 is fixed to the surface of mounting board 3, locking part 20a formed on the other end of each leaf spring 20 is locked to the surface of semiconductor package 1. As a result, semiconductor package is pressed to heat sink 8 by an elastic force of leaf springs 20 (i.e., locking parts 20a). In addition, locking part 20a is formed by bending one end of leaf spring 20.

Heat sink 8 is pressed to semiconductor package 1 by an elastic force of at least two elastic members (e.g., leaf springs 21) fixed to the rear surface of mounting board 3. More specifically, one end of each leaf spring 21 is fixed to the rear surface of mounting board 3, locking part 2a formed on the other end of leaf spring 21 is locked to the rear surface of heat sink 8. As a result, heat sink 8 is pressed to semiconductor package 1 by an elastic force of leaf springs 21 (i.e., locking parts 21a). In addition, locking part 21a is formed by bending one end of leaf spring 21.

In this configuration, the elastic forces of leaf springs 20 and 21 are set according to the following relationship: $f1 \leq f2$, where f1 is a tensile force acting on solder ball 2 caused by leaf spring 21 pressing heat sink 8 to semiconductor package 1, and f2 is a tensile force acting on solder ball 2 caused by leaf spring 20 pressing semiconductor package 1 to heat sink 8. As a result, tensile stress exceeding compressive stress does not act on solder balls 2, and thus there is no danger that solder balls 2 may damage connection reliability. In contrast, the connection reliability can be improved due to compressive stress acting on the solder balls 2.

According to the structure for mounting a semiconductor package of the invention, a heat-dissipating member can be brought into close contact with the semiconductor package without damaging the reliability of coupling parts between the semiconductor package and the mounting board.

The invention claimed is:

1. A structure for mounting a semiconductor package, in which the semiconductor package and a heat-dissipating member dissipating heat generated from the semiconductor package are mounted on a mounting board, wherein:
   a rear surface of the semiconductor package is bonded to a surface of the mounting board facing the rear surface,
   the heat-dissipating member is brought into contact with the rear surface of the semiconductor package through an opening formed in the mounting board,
   the semiconductor package and the heat-dissipating member are pressed to each other by a first elastic member which presses the semiconductor package to the heat-dissipating member and a second elastic member which presses the heat-dissipating member to the semiconductor package,
   wherein, a force of the first elastic member pressing the semiconductor package to the heat-dissipating member is greater than a force of the second elastic member pressing the heat-dissipating member to the semiconductor package.

2. The structure for mounting a semiconductor package of claim 1, wherein the rear surface of the semiconductor package is bonded to the surface of the mounting board facing the rear surface via a solder ball.

* * * * *